United States Patent [19]

Bittner

[11] Patent Number: 4,553,044
[45] Date of Patent: Nov. 12, 1985

[54] INTEGRATED CIRCUIT OUTPUT DRIVER STAGE

[75] Inventor: Harry J. Bittner, Santa Clara, Calif.

[73] Assignee: National Semiconductor Corporation, Santa Clara, Calif.

[21] Appl. No.: 493,539

[22] Filed: May 11, 1983

[51] Int. Cl.[4] .................. H03K 17/60; H03K 3/26
[52] U.S. Cl. .................................. 307/270; 307/254; 307/296 R; 307/303
[58] Field of Search .............. 307/270, 303, 296 R, 307/254, 255; 330/257, 258

[56] References Cited

U.S. PATENT DOCUMENTS

| 3,979,606 | 9/1976 | Ahmed | 307/296 |
| 4,004,242 | 1/1977 | Wheatley, Jr. | 330/257 |
| 4,331,886 | 5/1982 | Perner et al. | 307/296 R |
| 4,485,313 | 11/1984 | Nagano | 330/257 |

Primary Examiner—Stanley D. Miller
Assistant Examiner—B. P. Davis
Attorney, Agent, or Firm—Gail W. Woodward; Paul J. Winters; Michael J. Pollock

[57] ABSTRACT

An output stage suitable for monolithic semiconductor IC uses is disclosed. The stage employs a pair conventional NPN output transistors biased and driven with conventional bipolar IC elements. The pull up device, which sources output current for positive or rising inputs, is maintained on for negative signal swings so that it can be used to bias the pull down device which is cut off for positive signal swings.

6 Claims, 3 Drawing Figures

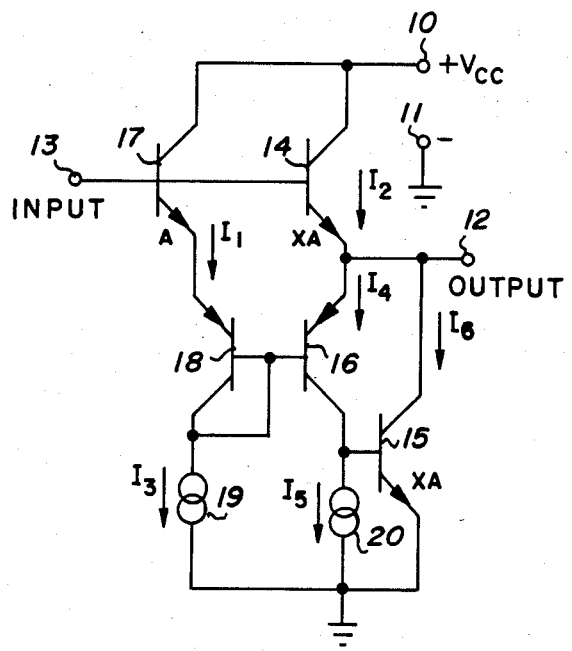
Fig_1
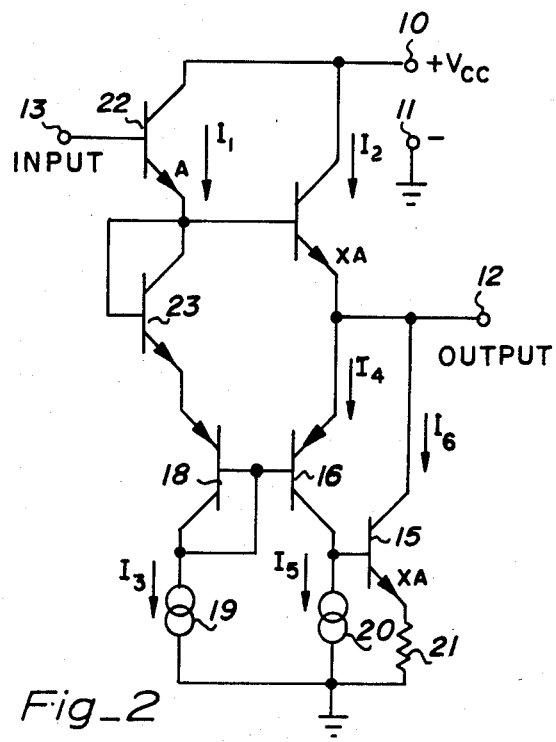
Fig_2
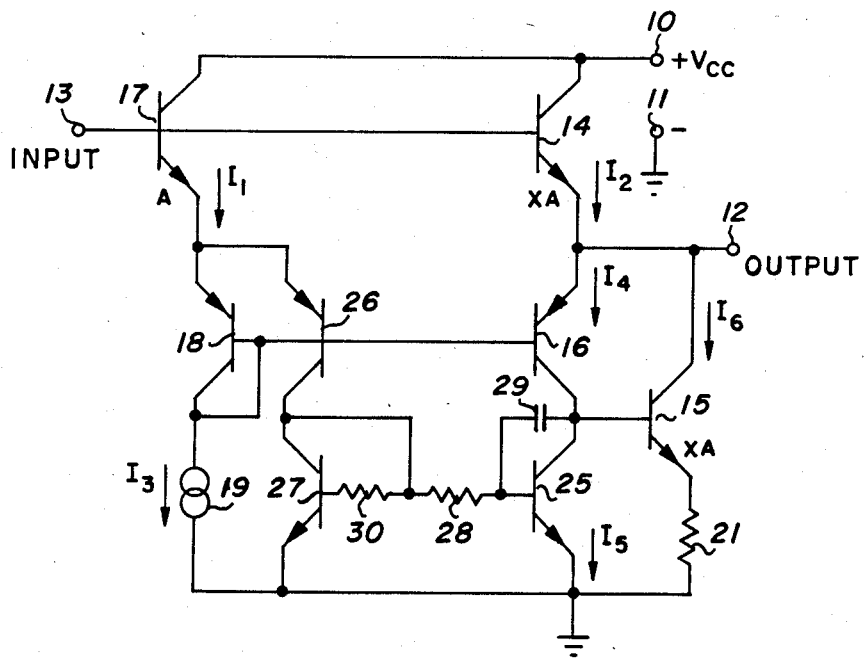
Fig_3

INTEGRATED CIRCUIT OUTPUT DRIVER STAGE

BACKGROUND OF THE INVENTION

The invention relates to the output stage employed in a monolithic silicon integrated circuit (IC) amplifier. One well-known form of output stage is disclosed and claimed in U.S. Pat. No. 3,974,456, which was issued to Ronald W. Russell and Kyle M. Black, on Aug. 10, 1976. This patent, which is assigned to the assignee of this application, teaches a pair of NPN output transistors which are biased by means of P-channel junction field effect transistor (JFET) devices. This circuit is exemplified in the LF156 which is available commercially from National Semiconductor Corporation and others.

Another commonly used IC amplifier output stage design which employs a complementary transistor is exemplified in the LM163, which is also commercially available from National Semiconductor Corporation and others. Here, an NPN transistor acts as an output terminal current source and hence provides the pull up function. A PNP transistor acts as a current sink to provide the pull down function. This configuration provides excellent performance but suffers an asymmetry in its current sinking capability. The PNP transistor is not able to sink as much current as the NPN transistor can source. It also suffers to a small degree, at the higher frequencies, from an asymmetry in the gain versus frequency roll off. In general, IC PNP transistors have a much lower gain bandwidth than the NPN transistors. When the complementary device circuit is employed at the higher frequencies, the output will display a phase shift between the positive and negative signal swings.

From the above, it is clear that NPN output devices are preferred, but, since the most popular such circuit employs JFET biasing, the JFET characteristics must be maintained under stringent manufacturing control.

SUMMARY OF THE INVENTION

It is an object of the invention to provide an IC output stage that employs NPN transistors which are biased using conventional bipolar circuit elements.

It is a further object of the invention to couple a pair of NPN output transistors connected together and to a biasing network that includes a current mirror that reflects the input current so that the output transistors are driven out of phase.

It is a still further object of the invention to employ a pair of NPN output transistors with the pull down device driven from a PNP transistor that produces a composite which also employs the PNP transistor as a current mirror that has an input coupled to the drive applied to the pull up device.

These and other objects are achieved in a circuit configured as follows. A pair of matched NPN output transistors have their emitter-collector circuits coupled in series between supply rails. The juncture of these two devices constitutes the circuit output node. A lateral PNP transistor is coupled to the pull down device to create a composite in which the NPN output pull down acts like a PNP as far as the signal path is concerned. However, as far as the output terminal is concerned, the NPN device performance is realized. The pull up device is driven from the stage input terminal either directly or by way of an emitter follower. A second PNP lateral transistor is coupled to the composite device to create a current mirror having an input that is directly coupled to the stage input terminal. The current mirror includes a pair of constant current sinks that act to provide the quiescent bias for the output stage. It can be seen that a PNP transistor biases the PNP composite output pull down driver while an NPN transistor biases the NPN pull up transistor.

BRIEF DESCRIPTION OF THE DRAWING

FIG. 1 is a schematic diagram of an output stage employing the invention.

FIG. 2 is a schematic diagram of an alternative embodiment of the invention.

FIG. 3 is a schematic diagram of an alternative embodiment having improved no load performance characteristics.

DESCRIPTION OF THE INVENTION

In FIG. 1, an output stage is shown being operated from supply rails with terminal 10 connected to $+V_{cc}$ and $-$terminal 11 grounded. The stage output is at terminal 12 and is driven from input terminal 13. In the following discussion, the transistor base currents will be ignored. Since the transistor base to collector current gain values orinarily are well in excess of 100, so that the base currents are less than 1% of the colector currents, this approximation is valid and useful.

NPN transistors 14 and 15 are the output transistors and are ordinarily matched (of the same size). Transistor 14 acts as the output terminal 12 pull up device and sources output current. Transistor 15 is the output pull down device that sinks output current. Lateral PNP transistor 16 is coupled to transistor 15 to create a composite in which an NPN output transistor acts as if it were a PNP transistor. The base of transistor 14 is directly driven from input terminal 13. Transistor 17, connected as an emitter follower, drives the emitter of transistor 18 from input terminal 13. Transistor 18 is a diode-connected PNP lateral which acts as a current mirror with PNP transistor 16. Constant current devices 19 and 20 provide transistors 18 and 16, respectively, with a current return path to ground.

Transistors 18 and 16 are matched to each other and constant current devices 19 and 20 are matched to each other so that the current mirror has unity current gain. It can be seen transistor 17 drives the emitter of transistor 18 with a $V_{BE}$ voltage shift while transistor 14 drives the emitter of transistor 16 with a similar $V_{BE}$ voltage shift. The quiescent bias on the circuit is set up as follows. Current sink 19 passes $I_3$ which flows in diode connected transistor 18 and transistor 17 so that $I_1 = I_3$. Since transistors 17 and 14 are ratioed and commonly driven, $I_2 = XI_1$ (where X represents the size ratio). Due to the current mirror formed by transistors 18 and 16, $I_4$ will approximate $I_1$. The conduction of $I_2$ in transistor 14 will act to pull terminal 12 up so as to increase $I_4$. $I_6$ flowing in transistor 15 will act to pull terminal 12 down. As terminal 12 rises it will pull the emitter of transistor 16 up and this acts to increase $I_4$. At some point, $I_4$ will exceed $I_5$ by an amount that provides sufficient base current to transistor 15 that its collector current, $I_6$, will balance $I_2$ so that $I_2 = I_6 + I_4$. Since $I_2 = 10I_1$ and $I_1$ approximates $I_4$, $I_6$ will be close to $0.9I_2$. Thus, the bias on transistor 15 is determined primarily by $I_5$. The quiescent bias will establish a potential at terminal 12 that is intermediate between $+V_{cc}$ and ground.

When a resistive load (not shown) is connected to terminal 12, the circuit will source or sink the load current depending upon where the load is returned. If the load is returned to ground, the circuit will source the load current as follows. With the load grounded, it will act to pull terminal 12 down. This will increase the $V_{BE}$ on transistor 14 and turn it on harder so that it will source the load current and counteract the load tendency to pull terminal 12 down. Such an action will also pull the source of transistor 16 down thereby reducing $I_4$ and as a result, $I_6$. At that point where $I_4$ drops to the level of $I_5$, transistor 15 will turn off.

When the load is returned to $+V_{cc}$ it will act to pull terminal 12 up. This will increase the $V_{BE}$ of transistor 16 and thereby increase $I_4$. This will increase the base current flowing into transistor 15 so that it will sink the load current and counteract the tendency of the load to pull terminal 12 up. However, it can be seen that this shift in output transistor operation does not turn transistor 14 off. It continues to conduct even though transistor 15 is sinking the load current. Thus, transistor 14 can continue to supply $I_4$ which acts to turn transistor 15 on.

When terminal 13 is coupled to a driver source, its level will normally be at $V_{BE14}$ above the level of terminal 12.

From the above, it can be seen that the NPN output transistors are biased and driven from conventional IC components and no JFET or other exotic devices are required. Furthermore, the output device does not require a large PNP transistor which would have a poor high frequency response.

FIG. 2 is an alternative embodiment of the circuit of FIG. 1. Where the parts function in the same way, identical numbers are used. The main difference is in the output stage input circuit. Transistor 14 is driven from emitter follower transistor 22 which also drives the current mirror. Diode connected transistor 23 provides a $V_{BE}$ level shift to drive the emitter of transistor 18 at $2V_{BE}$ below the level of terminal 13. The circuit operates in the same way as FIG. 1 except that terminal 13 is $2V_{BE}$ above terminal 12. Resistor 21 is included in the emitter of transistor 15 and acts to stabilize the feedback loop that results from transistor 16 acting with transistor 15. This resistor would have a typical value of about 20 ohms.

FIG. 3 is another alternative embodiment. Where the parts function in the same way as those of FIG. 1, the same numbers are used. Transistor 14–18 and constant current device 19 function in the same way. It can be seen in the embodiments of FIGS. 1 and 2, when the potential at terminal 12 varies, $I_4$ will be modulated because the collector to emitter voltage on transistor 16 varies. This in turn will vary $I_6$ because $I_5$ will remain constant. This means that under no load conditions the output signal variations will modulate the conductivity of transistor 15. This is undesirable because it represents a power dissipation with no load. The circuit of FIG. 3 avoids this. In FIG. 3, constant current device 20 has been replaced with the transistor 25 which is part of a second current mirror driven from transistor 17. The current flowing in transistor 18 is repeated in transistor 26 which is coupled to diode connected transistor 27. Since transistor 27 is directly coupled to transistor 25, the value of $I_5$ will be the same as the collector current of transistor 26, which also is mirrored as $I_4$. Since $I_4$ tracks $I_5$, there will be no change in the base current of transistor 15 and hence no change in $I_6$ resulting from the no load variations in potential at terminal 12.

It can be seen that the second current mirror (transistors 25 and 27) forms a high gain negative feedback loop around transistor 15. Resistor 28 and capacitor 29 frequency compensate this loop so that it will be stable at the higher frequencies. Resistor 28 is present because diode connected transistor 27 alone represents a low impedance to ground. Therefore, the presence of resistor 28 permits the use of a relatively small capacitor 29. Resistor 30 is present to balance the d-c characteristics of the current mirror. The value of resistors 28 and 30 is typically about 5k ohms which is small enough to have very little effect upon the d-c performance of the circuit. Typically, capacitor 29 will be about 5 picofarads.

The invention has been described and alternative embodiments detailed. When a person skilled in the art reads the foregoing, alternatives and equivalents, within the spirit and intent of the invention, will become apparent. Accordingly, it is intended that the scope of the invention be limited only by the following claims.

I claim:

1. A monolithic integrated circuit output stage having input and output terminals and first and second power supply rails connectable to a source of operating power, said stage comprising:
   a pair of like conductivity type transistors having their emitter-collector circuits coupled in series between said first and second rails with the juncture of said pair providing said output terminal;
   means for driving the base of one of said pair from said input terminal;
   current mirror means having an input coupled to said input terminal and an output coupled to drive the base of the other of said pair, said current mirror means including a pair of constant current devices, one coupled to said current mirror input and the other coupled to said current mirror output; and
   an emitter follower coupled to drive said input of said current mirror and having an input coupled to said input terminal.

2. The stage of claim 1 wherein said emitter follower also drives said base of said first transistor and a level shifting diode is used to couple said emitter follower to said current mirror input.

3. A monolithic integrated output stage having input and output terminals and first and second power supply rails connectable to a source of operating power, said stage comprising:
   first and second like conductivity type transistors having their emitter-collector circuits coupled in series between said first and second power supply rails, whereby the juncture of said first and second transistors provides said output terminal;
   means for coupling the base of said first tansistor to said input terminal;
   means for coupling the emitter-collector circuit of a third complementary transistor to the base of said second transistor to create a composite transistor;
   means for providing a first current path between said base of said second transistor and said second power supply rail;
   means for coupling the collector and base of a fourth complementary transistor together to the base of said third transistor to form a current mirror therewith and to a second current path to said second power supply rail; and
   a fifth emitter follower connected transistor of said like conductivity type for coupling the emitter of said fourth transistor to said input terminal.

4. The stage of claim 3, wherein said first and second current paths comprise the collector-emitter circuits of sixth and seventh like conductivity type transistors.

5. The stage of claim 4, further including means for modulating the conductance of said first current path to match the change in conductance of said third transistor that results from potential changes at said output terminal.

6. The stage of claim 5, wherein said means for modulation includes frequency compensation.

* * * * *